(12) United States Patent
Randall et al.

(10) Patent No.: US 7,570,112 B2
(45) Date of Patent: Aug. 4, 2009

(54) ULTRASOUND IMAGING OR OTHER USE VARIABLE INPUT IMPEDANCE PREAMPLIFIER

(75) Inventors: Kevin S. Randall, Ambler, PA (US); James J. Edelen, III, Jamison, PA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 570 days.

(21) Appl. No.: 11/303,852

(22) Filed: Dec. 15, 2005

(65) Prior Publication Data

US 2007/0164817 A1    Jul. 19, 2007

(51) Int. Cl.
*H03F 3/45* (2006.01)
(52) U.S. Cl. ......................... 330/252; 330/254
(58) Field of Classification Search ........... 330/165, 330/252, 254, 261, 276
See application file for complete search history.

(56) References Cited

U.S. PATENT DOCUMENTS

| | | | |
|---|---|---|---|
| 4,378,529 A * | 3/1983 | Dobkin .................... 330/257 |
| 4,901,758 A * | 2/1990 | Cook et al. .............. 137/487.5 |
| 5,724,312 A | 3/1998 | Oppelt | |
| 6,469,580 B1 | 10/2002 | Sanduleanu | |
| 6,537,216 B1 * | 3/2003 | Shifrin ..................... 600/437 |
| 6,573,788 B2 | 6/2003 | Oppelt | |
| 6,580,317 B1 | 6/2003 | Oppelt | |
| 6,844,778 B2 | 1/2005 | Oppelt | |
| 6,864,747 B1 | 3/2005 | Oppelt et al. | |
| 6,891,408 B2 | 5/2005 | Nishizono | |

OTHER PUBLICATIONS

U.S. Appl. No. 11/198,740, filed Aug. 5, 2005.
U.S. Appl. No. 11/197,929, filed Aug. 5, 2005.

* cited by examiner

*Primary Examiner*—Henry K Choe

(57) ABSTRACT

A preamplifier has a variable input impedance. The input impedance is tailored with the signal level to maintain a more optimal performance. The input impedance is varied by at least two amplifiers connected in parallel. Each amplifier has a different input impedance. By controlling the bias currents to the amplifiers, the contribution to the input impedance of the parallel amplifiers is controlled. Gradual variation in input impedance may be obtained by gradual variation in relative contribution by the different amplifiers.

23 Claims, 6 Drawing Sheets

ULTRASOUND IMAGING OR OTHER USE VARIABLE INPUT IMPEDANCE PREAMPLIFIER

BACKGROUND

The present embodiments relate to variable input impedance preamplifiers. For example, a variable input impedance preamplifier is used for ultrasound imaging. Other uses may be provided.

For ultrasound imaging, the transducer preamplifier is selected based on a trade-off of input impedance to get as close as possible to desired performance. A single impedance amplifier is typically used. Amplifier impedance and dynamic range are traded with only one optimized for the input signal. In ultrasound, the signal strength varies over time or as a function of depth from which received echo signals are reflected.

Ultrasound transducers have low impedance at a resonant frequency and higher impedance away from resonance. There may be less loss of signals away from resonance with a high impedance amplifier than with a low impedance amplifier due to the dominance of the transducer source impedance in the resistive divider formed between the transducer impedance and the preamplifier input impedance. This lower loss may enhance signal-to-noise ratio and bandwidth. With a low impedance preamplifier, the resistive divider is dominated by the preamplifier, causing higher loss of signals away from resonance and resulting in lower signal-to-noise and reduced bandwidth. The impedance of the transmit/receive switch may also causes higher losses with lower impedance preamplifiers.

Some amplifiers with variable input impedance have been used in ultrasound. For example, a switched resistance in a feedback path of a fixed gain amplifier is used to control gain, but also varies input impedance. Such a switched amplifier topology may change the impedance, but with an interruption in operation for switching.

BRIEF SUMMARY

By way of introduction, the preferred embodiments described below include methods, systems and preamplifiers for providing variable input impedance. The input impedance is tailored with the signal level to maintain a more optimal performance. The input impedance is varied by at least two amplifiers connected in parallel. Each amplifier has a different input impedance. By controlling the bias currents to the amplifiers, the contribution of the parallel amplifiers to the input impedance of the preamplifier is controlled. Gradual variation in input impedance may be obtained by gradual variation in relative contribution by the different amplifiers.

In a first aspect, a variable input impedance preamplifier is provided for ultrasound imaging. A lower input impedance amplifier connects in parallel with a higher input impedance amplifier. An ultrasound transducer connects with the higher and lower input impedance amplifiers.

In a second aspect, a variable input impedance preamplifier is provided. A lower input impedance amplifier connects in parallel with a higher input impedance amplifier. A control circuit connects with the higher and lower impedance amplifiers. The control circuit is operable to control an input impedance of the preamplifier in conjunction with a variance in gain of the preamplifier.

In a third aspect, a method is provided for varying an input impedance of a preamplifier used for ultrasound imaging. Contribution to the input impedance of the preamplifier transitions from a lower input impedance amplifier to a higher input impedance amplifier as a function of time. The lower and higher input impedance amplifiers connect in parallel. Ultrasound signals are amplified with the preamplifier while transitioning.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Impedance and gain of a preamplifier are programmably controlled by either a processor and software or a dedicated circuit. The preamplifier varies a voltage or current as a function of time or depth (e.g., time gain control (TGC)) in conjunction with varying input impedance.

The embodiments below are for a preamplifier with controllable input impedance and circuits to control the transition of the impedance. The preamplifier has two input amplifiers connected in parallel. One amplifier has a relatively low input impedance, and the other amplifier has a relatively high impedance. The input impedance variably crosses between the lower and higher input impedance amplifiers. When connected with an ultrasound transducer, the higher input impedance provides better SNR and wider overall bandwidth, and the lower input impedance provides higher dynamic range and larger signal handling capability. By selecting the gains and the contribution to input impedance, both time gain control and an impedance shift may be accomplished. At close range in ultrasound, the gain and input impedance of the input amplifiers are low to accommodate the large reflected signal levels. As the propagation depth increases, the gain and impedance are raised to improve sensitivity and SNR.

A significant effect of input impedance is transducer pulse response (i.e. bandwidth). Generally, for ultrasonic probes, a high impedance preamplifier provides faster pulse response. As a generalization, the low input impedance preamplifier provides smoother pulse shapes and generally lower axial sidelobes.

In the embodiments shown in FIGS. 1-7, different resistor, voltage, and capacitor values are shown. Other values may be used. Different amplifiers or transistors may be used. A complimentary topology could be used by substituting PNP transistors for NPN transistors. Other impedance crossover control functions and circuits could be used as well as different scaling factors on the impedance ratios. The secondary gain control differential pairs could be substituted with other gain control methods. Other connections or networks may be used. The circuits are formed on a same integrated circuit or separate integrated circuits. Alternatively, one or more of the circuits or components are discrete.

Figure 1:
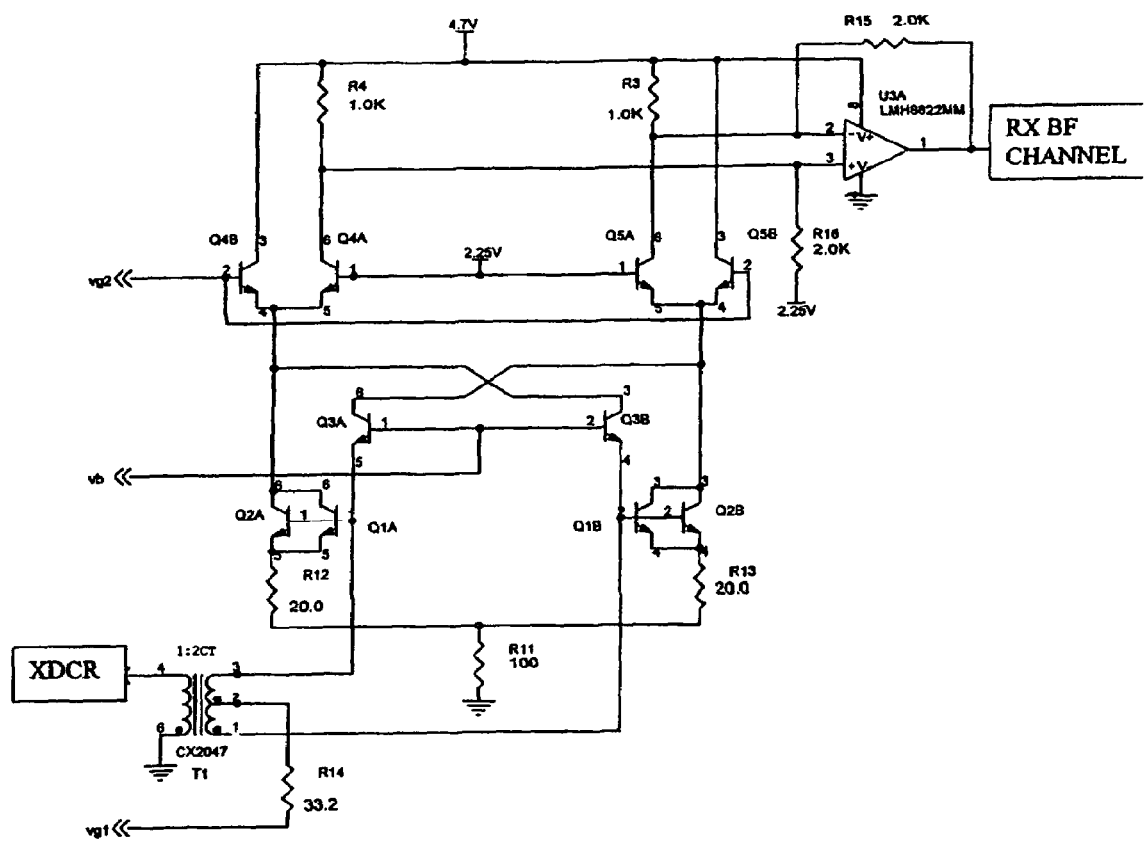
FIG. 1 is a circuit diagram of a preamplifier in one embodiment.

FIG. 1 shows a variable input impedance preamplifier. The preamplifier is used for ultrasound imaging, such as being connected between an ultrasound transducer and a receive beamformer. One preamplifier is provided for each ultrasound transducer and receive beamformer channel. Other uses may be provided. The preamplifier combines two or more types of input amplifiers, lower and higher input impedance amplifiers. Each input amplifier is operational in a gain range where the attributes of the amplifiers are most desirable. At low gains, the lower input impedance amplifier is used primarily to maximize large input signal handling. At high gains, the higher input impedance amplifier is used primarily to improve the noise performance. By varying the bias currents to the higher and lower input impedance amplifiers, it is possible to vary smoothly from low gain and low input impedance to high gain and high input impedance. In the middle range, both lower and higher input impedance amplifiers are active. The gain and input impedance varying according to the amount of bias current flowing in each of the lower and higher input impedance amplifiers.

FIG. 1 shows the preamplifier with an ultrasound transducer, a transformer T1, an input (first) stage, an output (second) stage, and a differential amplifier U3A. Additional, different or fewer stages or components may be used. For example, the input stage is provided without the second stage. As another example, a non-differential configuration is provided without the transformer T1 or differential amplifier U3A.

The ultrasound transducer is a piezoelectric element. A piezoelectric block or a composite material may be used. Electrodes are positioned on opposite sides of the piezoelectric material. For receive operation, acoustic energy causes the piezoelectric material to expand or contract, generating electrical differential across the electrodes. One electrode is grounded or held at a desired potential. The other electrode connects with the input stage. In particular, the electrode connects directly with the transformer T1 and indirectly to the transistors Q1A/B, Q2A/B, and Q3A/B of the input stage.

Figure 2:
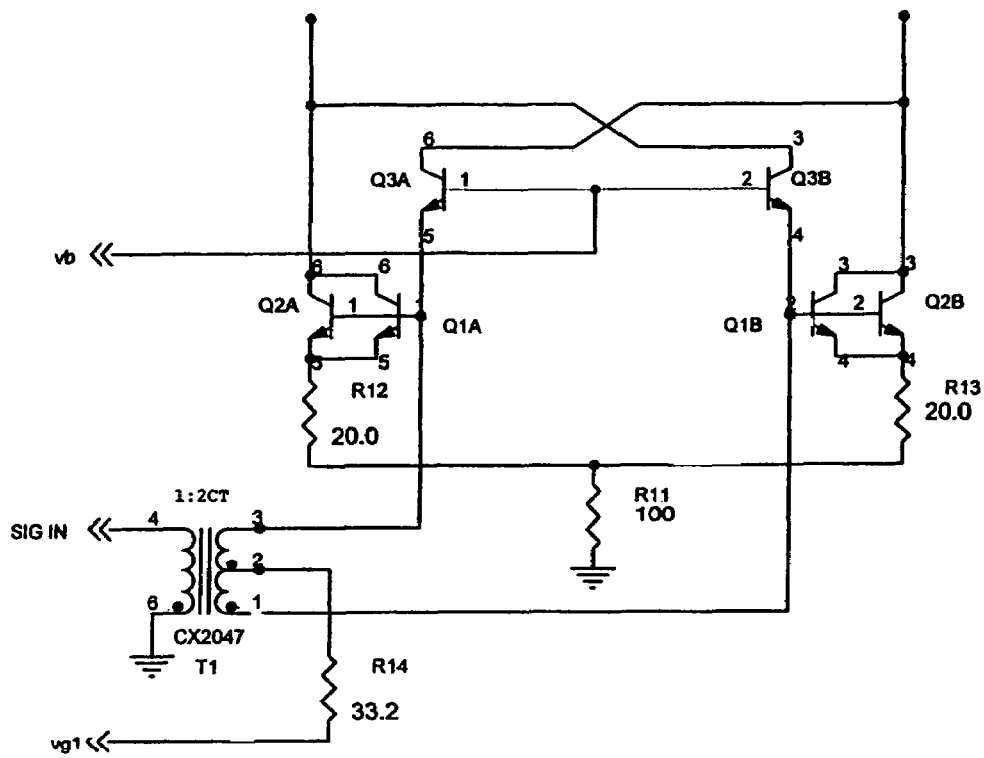
FIG. 2 is a circuit diagram of an input stage of the preamplifier of FIG. 1.

FIG. 2 shows the input stage and the transformer T1 of the preamplifier of FIG. 1. The transformer T1 has an input connected with the ultrasound transducer. Two outputs each connect with the lower and higher input impedance amplifiers formed from the transistors Q1A/B, Q2A/B, and Q3A/B. The turns ratio is 1:2 to provide lower noise for higher gains in the transducer source impedance range. The transformer T1 increases the gain control range of the input stage by providing a 1:2 voltage step up and a 2:1 current step down. As input stage operation varies from voltage mode (common-emitter) to current mode (common-base), the gain is 2 in voltage mode and ½ in current mode, giving a 4× gain change. Other turns ratios may be used. The transformer T1 converts the single-ended input signal into a differential signal. In an alternative embodiment, the preamplifier and/or input stage is single ended.

The input stage includes transistors Q1A/B, Q2A/B, and Q3A/B. In the input stage, a higher input impedance amplifier is provided by the transistors Q1A/B, Q2A/B. The transistors Q1A/B, Q2A/B form a differential amplifier in a common emitter configuration. The input impedance of the transistors Q1A/B, proficient Q2A/B is about 450 ohms||20 pF, but other input impedances may be provided. Two parallel pairs of transistors Q1A/B, Q2A/B reduce noise, such as by reducing the effective base resistance of the input pair. Other higher input impedance configurations or components may be used.

Also in the input stage, a lower input impedance amplifier is provided by the transistors Q3A/B. The transistors Q3A/B form a differential amplifier in a common base configuration. The input impedance is about 25 ohms or less, but greater values may be provided. Lower and higher are used as relative terms. The gain of the lower input impedance amplifier is dependent on the source impedance of the ultrasound transducer. Thus, the gain control range of the input stage is dependent on the source impedance of the ultrasound transducer.

The lower and higher input impedance amplifiers connect in parallel. The output from the transformer T1 connects with the transistors Q1A/B, Q2A/B and Q3A/B. The outputs from the transistors Q1A/B, Q2A/B and Q3A/B connect the lower and higher impedance amplifiers with the second stage.

In general, there are three ranges or regions of operation of the variable-input-impedance input stage of the preamplifier. Low gain and input impedance are provided by only or primarily using the lower input impedance amplifier. The bias provided to the higher input impedance amplifier is a sufficiently low value to turn off the corresponding transistors (Q1A/B and Q2A/B). High gain and impedance are provided by only or primarily using the higher input impedance amplifier. The bias provided to the lower input impedance amplifier is a sufficiently low value to turn off the corresponding transistors (Q3A/B). Gains and input impedances between the maximum and minimum for the input stage (crossover region of operation) maintain operation or biases for both the higher and lower input impedance amplifiers. By varying the bias currents to the lower and higher input impedance amplifiers, the input stage may gradually transition between the lower and higher input impedance amplifiers.

Referring again to FIG. 1, the second stage includes a current steering pair of transistors Q4A/B, Q5A/B. The collector currents of the input stage connect with the current steering pair of transistors Q4A/B, Q5A/B. The input stage varies a gain over a first range. The second stage varies the gain over an additional range to achieve a total desired range, such as a total of 50 dB. The output of the second stage is converted to single-ended with the differential amplifier U3A.

In the embodiment shown in FIG. 1, the noise with a source impedance of 50 ohms is 1.7 dBNF. At 100 and 150 ohms, the noise is less than 1 dBNF at a spot frequency of 5 MHz. These noise includes any transmit/receive switch with a diode bridge in a return leg of the input transformer T1 (not shown). Greater (e.g., about 3 dB) or lesser noise may be provided.

The second harmonic distortion is less than −60 dBc with a 5 MHz carrier at full output in pulsed modes, but may be greater. Over useful signal levels, the preamp may achieve >60 dB rejection of second harmonic with a 5 MHz carrier. At extremely large input signal levels, less rejection may be provided. For large input signal levels, the second harmonic rejection may not be as important, since there may be no second harmonic signal of interest at large amplitudes. At shallow depths associated with larger signals, the signal has not propagated far enough to generate any significant second harmonic information.

The range of gain control is approx 50 dB, but greater or lesser range may be provided. Two gain controls are provided in the preamplifier. The input stage has a gain control range that depends on the source impedance, and the second stage has a practical gain range of >60 dB. In this embodiment, the input stage may have 16 dB of gain control range with a source impedance of about 110 ohms. For source impedances above or below 110 ohms, the gain range may be proportionately larger or smaller, respectively. By limiting the second stage to a gain range of 34 dB, the total gain range of the preamplifier is 50 dB.

Input signal handling in pulsed modes is about 4 mAp-p (short circuit current) at minimum gain, but other values may be provided. With the second stage gain control at a minimum gain of −36 dB, and the input stage at minimum gain, the input signal handling may be >6 mApp. At 6 mApp, the output second harmonic component (5 MHz carrier) is about −58 dBc and the third harmonic is about −50 dBc. At 2 mApp input, and the second stage gain set to give a full output signal level, the second harmonic level is <−65 dBc and the third harmonic is about −52 dBc The power consumption less may be less than 50 mW per receive beamformer channel, including any transmit/receive switch. The power consumption varies with the input stage gain setting. At high gain, the power consumption may be 58 mW, and at low gain, the power consumption may be 60 mW. Greater or lesser power consumption may be provided. Power is taken from a 5V power supply, but other voltage supplies may be used. In continuous wave (CW) mode, the input stage bias current is set higher for higher signal handling, and the total power may be about 100 mW.

For discrete circuit embodiments, such as that disclosed here, the size of the preamplifier may be less than about 0.75 in$^2$. A preamplifier board with four channels may be laid out on a PC board of about 3 in$^2$, including connectors, supply bypassing, transmit/receive switch, CW logic and switching circuitry not shown in FIG. 1. Greater or lesser sizes may be used.

The ultrasound receive beamformer channel includes any further time gain control amplifiers, delays, phase rotators, mixers, summers, modulators, base band filters, combinations thereof or other components for beamforming from ultrasound signals received from a plurality of the preamplifiers and associated ultrasound transducers. The receive beamformer channel connects with the lower and higher input impedance amplifiers, such as an indirect connection through the second stage.

A control circuit or circuits control the gain and input impedance of the preamplifier. Bias currents of the higher and lower input impedance amplifiers (transistors Q1A/B, Q2A/B, and Q3A/B) are varied. As ultrasound signals from greater depths (increasing amount of time) are received, the amplitude of the signals decreases. The gain is increased as a function of time to compensate for the greater attenuation of the signals. The input impedance is also increased for desired pre amplification attributes, such as signal to noise ratio and bandwidth. Gain and impedance may be decreased as a function of time.

The control circuit is a processor, integrated circuit, discrete circuit or other device. In the embodiment of FIG. 1, the preamplifier includes three control inputs, vg1, vg2 and vb. One control input vg1 in conjunction with the control input vb controls the gain and associated impedance of the input stage. Another control input vg2 controls the gain of the second stage. The control input vg1 controls the bias of the high input impedance amplifier. The combination of vb and vg1 controls the bias of the low input impedance amplifier. Additionally, different or fewer control inputs may be provided.

The control circuits are responsive to a single time gain control input, TGC. The TGC signal is split to provide separate time-gain control signals, TGC1 and TGC2, for the input and output stages (see FIG. 7). TGC1 passes through an anti-log stage with temperature compensation for controlling a gain current Igain (see FIG. 5). Igain connects with a reference gain stage for controlling the gain of the input stage with the vg1 and vb signals (see FIGS. 3 and 4). The vg1 signal is also responsive to the vb signal (see FIG. 4) as well as used to generate the vb signal (see FIG. 3). For the second stage, TGC2 connects with a reference gain stage outputting vg2 (see FIG. 6). vg1 and vb are also provided to the output stage reference gain control circuit to bias the circuit in a way that is identical or similar to the circuit it is controlling (see FIG. 6). Other combinations of circuits with the same or different interrelationship of control signals may be provided. Additional, fewer or different control signals and/or control circuits may be provided, such as using the input stage and associated control circuits without the second stage and associated control circuits.

The control inputs are independent of each other or may be dependent on one or more other control signals. In one embodiment, vb is a constant bias voltage and TGC1 is varied to control gain and input impedance. In another embodiment, vb depends on vg1. The base of the lower input impedance amplifier is driven by vb as an attenuated and voltage level shifted signal as compared to vg1. Gain control and input impedance control of the input stage are both dependent on how signals vb and vg1 are driven. The dependence of vb on vg1 disclosed here increases the voltage change on vg1 required in order to turn the common-base lower input impedance amplifier on and off. The level shifting is partly a voltage shift and partly a reference junction base-emitter voltage drop. The motivation for doing this is to match the voltage change of vg1 required to turn off the low input impedance amplifier to the change required to turn on the high input impedance amplifier. Different sources of level shifting may be provided.

Figure 3:
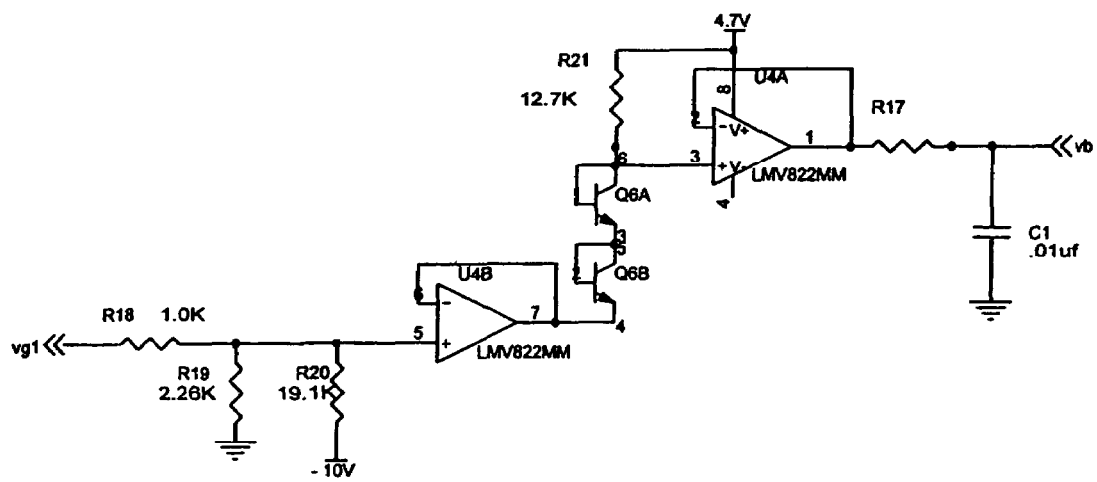
FIG. 3 is a control circuit diagram of one embodiment of a bias voltage generator, replicated as part of FIG. 6.

FIG. 3 shows one embodiment of a control circuit for generating the voltage or current bias, vb. Amplifiers U4A/B buffer nodes in the circuit that otherwise would interact in an undesirable way. This control circuit performs level shifting and attenuation of vg1. Generally, Q6A and Q6B may mimic the biasing arrangement of the lower and higher input impedance amplifiers in the crossover region of operation. The amount of current flowing in Q6A/B may be reflected in the amount of current flowing in the moderately biased lower and higher input impedance amplifiers. The attenuation of the input vg1 reflected in vb expands the voltage range over which vg1 must swing to transition the lower input impedance amplifier from off to on, in order to match its range to that required to transition the higher impedance amplifier from on to off. The voltage shift and attenuation may be determined empirically, considering the current flowing in each of the lower and higher input impedance amplifiers separately and then fitting them together to provide a smooth crossover and reasonably constant total bias current from the common-emitter region, through the crossover to the common-base regions. The bias current of the higher input impedance amplifier may be somewhat higher at high gains to improve noise figure.

The control circuit also acts as a temperature compensation circuit. The control circuit of FIG. 3 is included in or on the preamplifier module. The close proximity to the input stage may provide better temperature compensation. In a similar way, the equivalent circuit is included in FIG. 6 to act as temperature compensation to the input stage bias current mimicking transistors Q5A/B, Q6A/B, and Q7A/B. For this reason, Q8A and Q19B are kept in close proximity to Q5A/B, Q6A/B, and Q7A/B.

Figure 4:
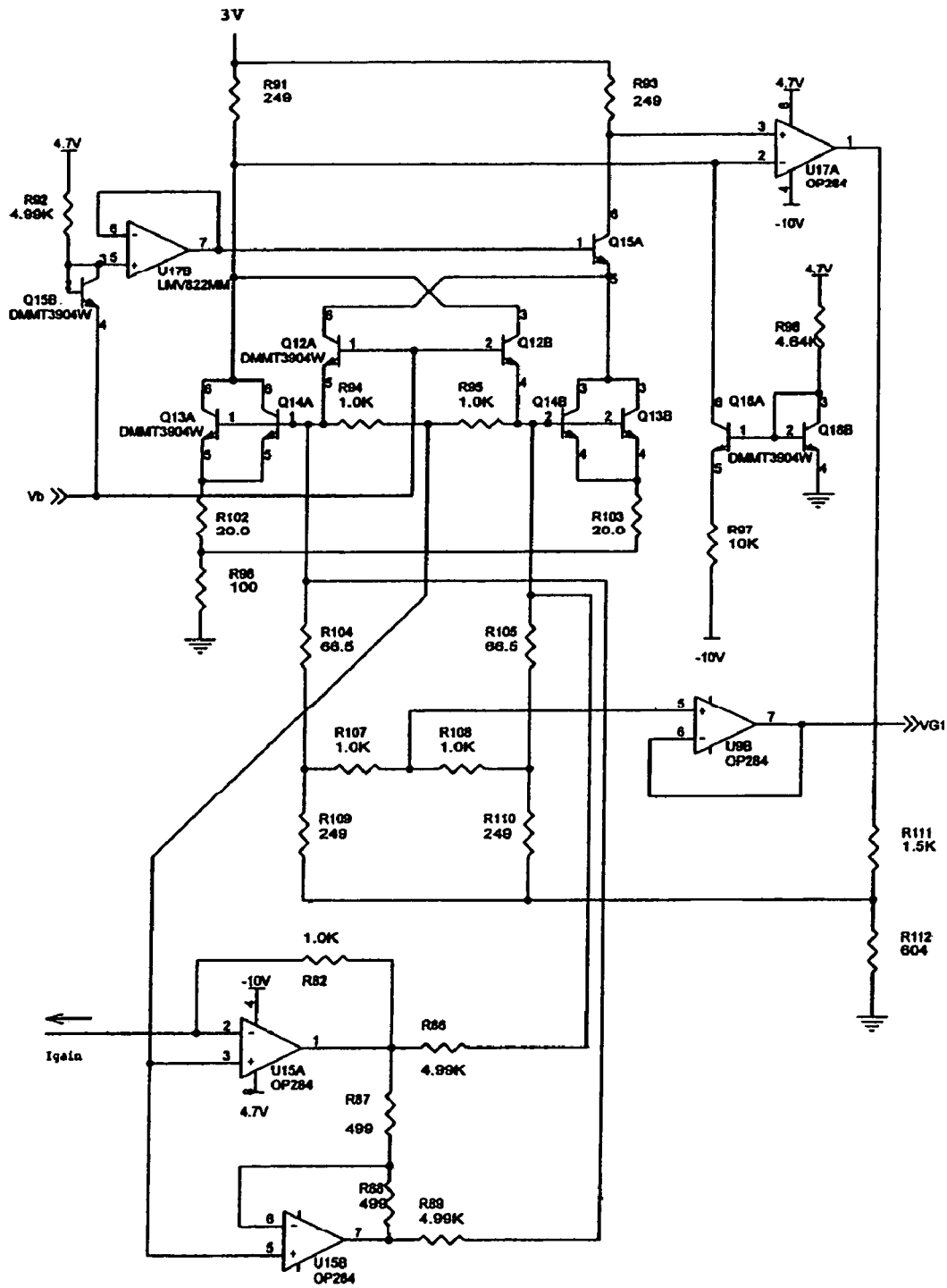
FIG. 4 is a control circuit diagram of one embodiment of a reference gain stage for an input stage.

The input impedance of the preamplifier is controlled in conjunction with a variance in gain of the preamplifier. The gain of the preamplifier varies as a function of the bias currents. FIG. 4 shows the control circuit for controlling the input stage of the preamplifier. The input stage is controlled by placing a reference gain stage in a feedback loop, configured in the same way as the input stage, and operating at the same bias levels. The reference gain stage mimics the operation of the input stage of the preamplifier in the feedback loop. The feedback loop acts to extract the control signal required to balance a variable input offset, Igain, with an opposite polarity, fixed output offset. The feedback loop senses the net output offset and drives the gain of the input stage to equalize the two offsets, creating a net output offset of zero. The gain signal vg1 is used to drive multiple preamplifiers or channels, which then operate at the same gain as the reference channel. By varying the input offset Igain, the reference gain stage is driven to a variety of gains. The ratio of the output offset to the input offset is the gain.

Q12A/B, Q13A/B and Q14A/B mimic the input stage of the preamp. The input offset Igain is input by the operational amplifiers U15A/B. The operational amplifiers U15A/B receive a current based gain control signal (Igain) and drive a differential signal across the input nodes of the reference stage transistors Q12A/B, Q13A/B and Q14A/B. The common-mode operating point for operational amplifiers U15A/B is sensed from the reference stage, and so their outputs float to the operating bias point of the reference stage. In this way, the amplifiers U15A/B drive only the differential voltage of the reference input, not the common-mode voltage. The operating point of the reference and input stages move up and down in common-mode voltage depending on the gain setting.

The resistors R104 and R105 together mimic the 33.2 ohm transformer center-tap resistor (R14) in the preamplifier (see FIG. 1). They are split into two parallel resistors to accommodate feeding in the input offset through resistors R86 and R89. The resistors pairs R94, R95 and R107, R108 sense the common-mode voltage of the two nodes to which they are tied.

The value of resistors R109/R107 and R110/R108 are chosen to set the effective source resistance of the input offset signal driven into the reference stage by U15A/B. They are analogous to the source impedance of the transducer feeding the input stage. At minimum gain, the gain depends on the current into the common-base pair emitters (Q12A/B) which is the open-circuit voltage divided by the source impedance. Since the gain of the low input impedance amplifier depends on the source resistance, the lowest gain and therefore the gain control range of the input stage both depend on the value of the source impedance. At high gains, the input impedance of the input stage is relatively high so the gain is relatively independent of the source impedance, and the amplifier responds primarily to the open-circuit voltage of the source. The source resistance set primarily by R104, R105, R107, R108, R109 and R110 is fairly representative of a typical transducer impedance, after accounting for the 4× impedance step-up of the input transformer T1. The resistance of the resistor network between the input nodes, including R86, R89, R104, R105, R107, R108, R109, and R110 is about 400 ohms. This value is similar to a transducer source impedance of about 100 ohms given the 4× impedance step-up of the transformer T1.

At maximum gain in the input stage, the gain is relatively independent of the source impedance of the ultrasound transducer. At minimum gain in the input stage, the gain is approximately inversely proportional to the source impedance of the ultrasound transducer. The nominal gain control range of the input stage is 16 dB with a source impedance of about 100 ohms, but other ranges may be provided. For a transducer source impedance of 50 ohms, the input stage gain control range is approximately 10 dB because the low gain is approximately 6 dB higher than if the source impedance were 100 ohms.

The output offset is fed in by the transistor Q18A. U17A detects the net output offset and drives the vg1 node to drive the gain of the reference stage to equalize the input and output offsets. vg1 is output through the buffer U9B as a preamplifier input stage gain command. vg1 is sensed as the common mode voltage at 33.2 common-mode ohms away from the input nodes where vg1 is fed into the preamplifier. Other values may be used.

In operation, the loop error amplifier, U17A, drives the loop to effectively zero the voltage difference between the input nodes of the loop error amplifier U17A. The currents flowing in the collector resistors, R91 and R93, are about equal, but the currents flowing in the two halves of the reference gain stage are unequal by the current that flows into the collector of transistor Q18A. The transistor Q18A provides the output offset. Because of this differential current in the reference input stage, the transistors Q12A/B, Q13A/B and Q14A/B of the input differential pairs dissipate different amounts of heat. The transistors Q12A/B, Q13A/B and Q14A/B are matched, but may not be thermally coupled. Q15A holds the collectors of transistors Q13B, Q14B, and Q12A at a lower collector-to-emitter voltage to offset the effects of the extra collector current being carried, approximately equalizing the power dissipation of the transistors Q13B, Q14B, and Q12A to transistors Q13A, Q14A, and Q12B. Transistors Q15A/B, resistor R92 and amplifier U17B hold the collector voltage at vb, substantially equalizing the power dissipation over the gain control range.

The bias signal, vb, controls the bases of the common-base pair of transistors Q12A/B. The circuit used to generate vb is the same as the circuit used to generate vb for the preamplifier (i.e., FIG. 3), but different circuits may be used.

Figure 5:
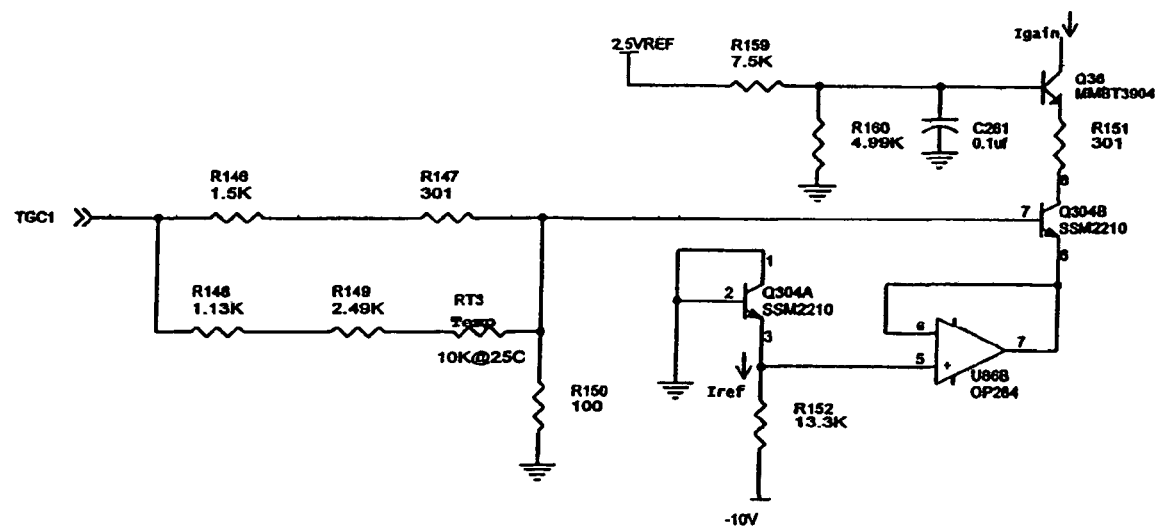
FIG. 5 is a control circuit diagram of a anti-log stage with temperature compensation according to one embodiment.

Because the gain control is linear or controls gain as a ratio, not logarithmically, the gain signal Igain is linear. The TGC command voltage in ultrasound is typically logarithmic (in dB/V), but may be linear. The logarithmic TGC command voltage is converted to a linear signal in one embodiment. FIG. 5 shows such an anti-log control circuit. The anti-log control circuit uses the exponential relationship of collector current to base-emitter voltage for a bipolar junction transistor. This relationship is temperature dependent. Temperature compensation is provided by a NTC thermistor RT3 in conjunction with R146, R147, R148, R149 and R150 to compensate the base drive voltage, optimized for the range 25 C to 60 C. Alternate methods may be used, such as piecewise linear approximation.

The anti-log control circuit includes a matched pair of transistors Q304A/B to generate the anti-log function. The collector current in transistor Q304A (Iref) is set by R152. The emitter voltage of Q304A is buffered by U86B and driven into the emitter of the anti-logging output transistor Q304B. The base of the transistor Q304B is driven by the voltage-divided input. For a TGC1 input of 0V, the collector current Igain is the same as Iref. The gain factor for TGC1 is 20 dB/V, but other values may be provided. The gain factor is a scale factor that relates TGC1 to Igain above or below 0V. More precisely, Igain=Iref($10^{(TGC1)}$). With the circuit shown, the gain of the input stage decreases for increasing values of the TGC1 command voltage, because the gain of the reference stage is equal to the output offset (a fixed value) divided by the input offset, and the input offset is Igain, so as Igain increases, stage gain decreases.

The collector of the output transistor is in cascade with Q36 and R151 to approximately normalize the power dissipation in the output transistor Q304B to that of the reference transistor Q304A. This equalization is approximate. The equalization may be avoided or not provided where there is good thermal coupling between transistors Q304A/B.

The control circuits of FIGS. 3-5 control the gain of the input stage. The gain of the input stage is a function of input impedance. Another control circuit controls the gain of the second stage of the preamplifier. In general, there are two control circuits, one for each gain control stage of the preamplifier. The two gains are adjusted at a same time, at different times or combinations thereof. For example, the gain of the input stage is varied first from a minimum to a maximum. The gain of the second stage is varied after the gain of the input stage is at a maximum. The gain of the second stage is varied from a minimum to a maximum. Alternatively, the gain of the second stage is varied before the input stage.

Figure 6:
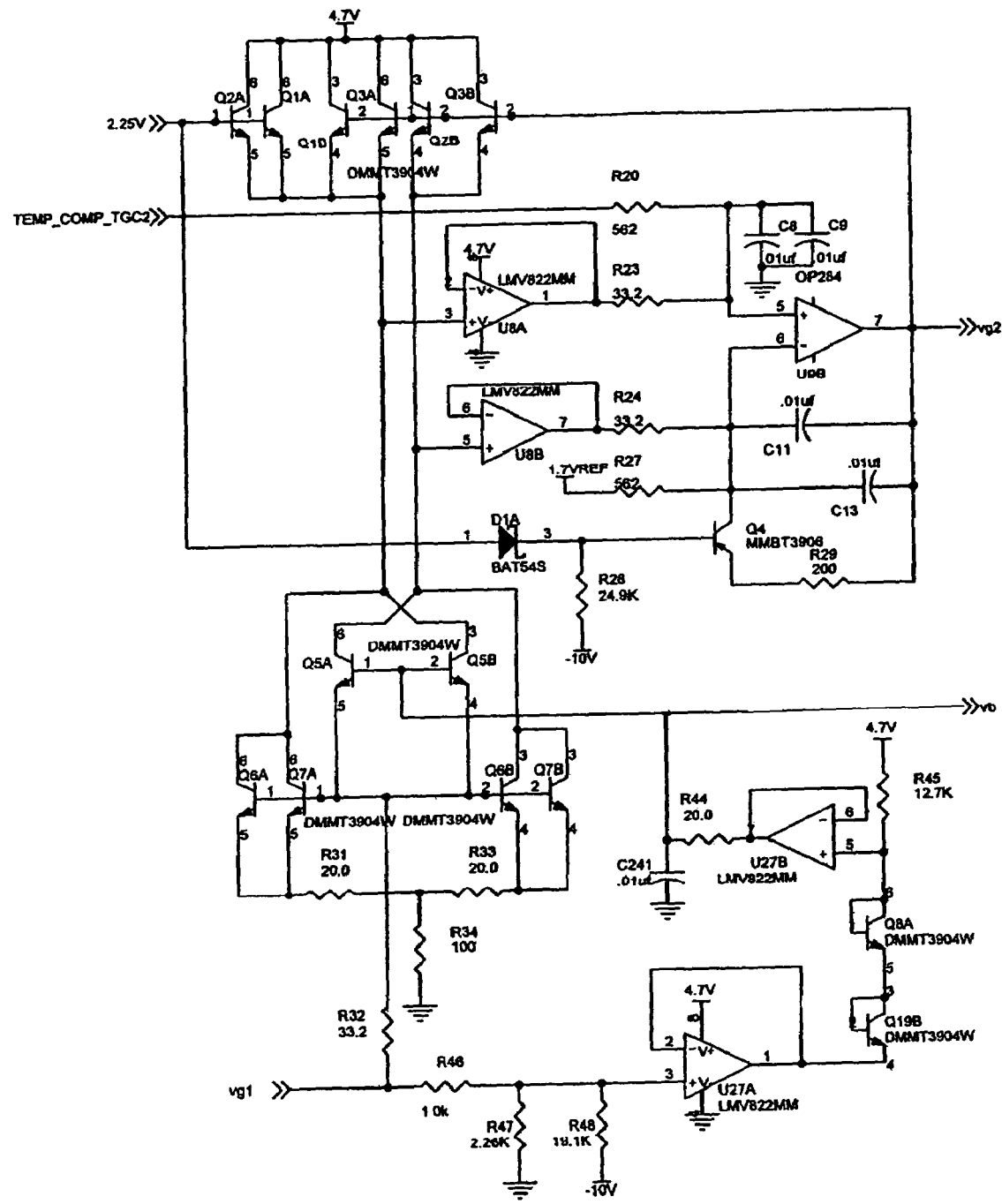
FIG. 6 is a control circuit diagram of one embodiment of a reference gain stage for a second stage.

FIG. 6 shows the control circuit for controlling the second stage (current-steering amplifier) of the preamplifier. The maximum current gain of the second stage is 1. The gain is controlled by the differential base voltage applied to the transistors Q4A/B and Q5A/B (see FIG. 1) of the second stage. At low gains, the base voltage to gain relationship approaches logarithmic, but near maximum gain, the relationship deviates significantly. The gain function is also temperature dependent. This control circuit of FIG. 6 includes a reference amplifier to mimic the operation of the second stage of the preamplifier. The reference amplifier is Q1A/B, Q2A/B and Q3A/B. The gain voltage derived from this reference amplifier sets the second stage to the commanded gain.

Figure 7:
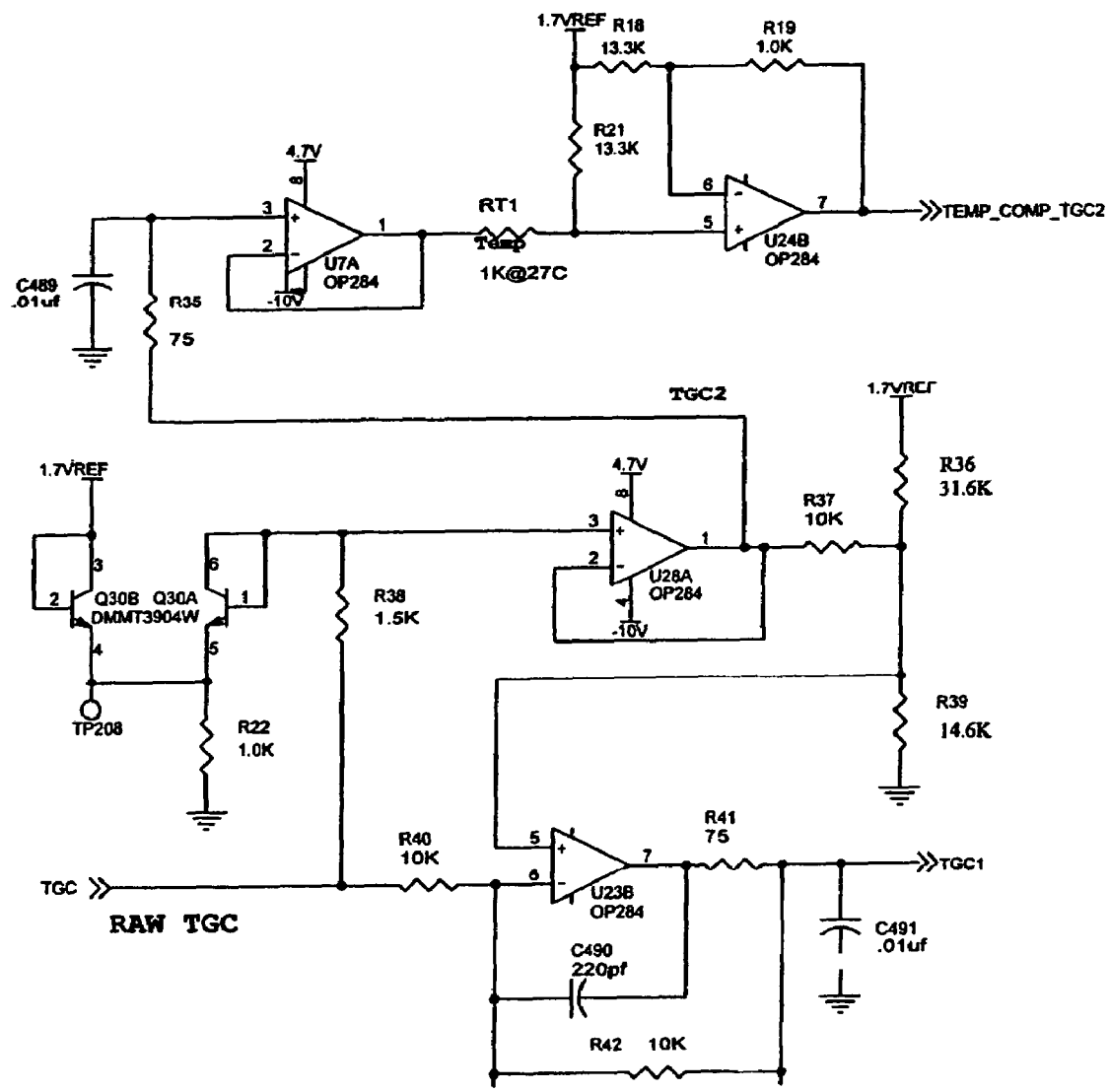
FIG. 7 is a control circuit diagram of one embodiment of a gain control splitter with temperature compensation.

To implement second stage gain control, the temperature dependent relationship between base-emitter voltage and emitter (or collector) current is used. The second stage is controlled to route a fraction of the total emitter current into the output path on one of the collectors. The gain control voltage compensates for temperature dependence. The circuit for implementing the temperature compensation is shown in FIG. 7 and outputs the control signal TEMP_COMP_TGC2. This control signal operates over a voltage range of about 0V (e.g., the temperature dependent point) to 1.7V. 1.7V corresponds to the maximum gain (i.e., unity current gain). The low gain voltage corresponds to a second stage gain of about −34 dB and varies with temperature. The low gain voltage is about 0V at 25 C. Like the input stage gain control, the second stage gain control signal provides a gain slope of 20 dB/V, but other slope may be used.

A portion of the control circuit for the second stage re-creates the collector current that would be coming from the preamplifier input stage to the second stage. Q5A/B, Q6A/B, and Q7A/B are configured as a preamplifier input stage. U27A/B and Q8A/B mimic the vb voltage generator used on the preamplifier. The vb output generated may be also used in the control circuit for the input stage.

The transistors Q1A/B, Q2A/B, and Q3A/B emulate the function of the gain steering pairs of transistors Q4A/B and Q5A/B of the second stage of the preamplifier. The gain is set by controlling the relative emitter voltage of the pair of transistors Q1B/Q3A relative to the pair of transistors Q2B/Q3B. Because of the relationship between base-emitter voltage and emitter current, current gain is controlled as the exponential of the differential base-emitter voltage. The pair of transistors Q1A/Q2A represents a shunt path carrying current necessary to create a differential emitter voltage between the other two pairs of transistors Q1B/Q3A and Q2B/Q3B. In alternative embodiments, three or other number of transistors implement this function. The three transistors should be reasonably well matched. Since matched transistors may be available only in matched pairs, six transistors Q1A/B, Q2A/B, and Q3A/B may be used as shown. By intermingling the three pairs, the mismatch between any two positions may be reduced.

The feedback loop around amplifier U9B creates the base voltage (vg2) relative to 2.25V necessary to create a voltage differential between the emitters of Q1A/Q1B/Q2A/Q3A and Q2B/Q3B. This voltage differential results from the amount of shunt current flowing in Q1A/Q2A. This shunt current is the difference between the emitter currents of pairs Q1B/Q3A and Q2B/Q3B. In the second stage amplifier, this difference current is the amount of signal current that is shunted away from the signal path, and therefore represents attenuation. The difference current is proportional to the exponent of the difference voltage between the emitters of Q1A/Q1B/Q2A/Q3A and Q2B/Q3B. This accommodates the logarithmic scaling used for the control signal TEMP_COMP_TGC2. When the shunt current in Q1A/Q2A is zero, there is no attenuation of the signal, and the gain of the second stage is unity. Also, the voltage differential between Q1A/Q1B/Q2A/Q3A and Q2B/Q3B is also zero. When there is significant shunt current, the gain of the second stage is significantly reduced. Likewise, there is a significant differential voltage difference between Q1A/Q1B/Q2A/Q3A and Q2B/Q3B. U8A/B are used to buffer the emitter voltages of Q1A/Q1B/Q2A/Q3A and Q2B/Q3B to drive the inputs of the differential amplifier U9B without disturbing the current flows in the emitter circuits.

FIG. 7 shows the control circuit for splitting the TGC command signal into two parts, one for the input stage gain control (TGC1) and the other for the second stage gain control (TGC2). The control circuit of FIG. 7 operates to first increase one of the input and output stages to a maximum gain and then increase the other one of the output and input stages to a maximum gain. Starting from minimum gain, the control circuit ramps the second stage gain (TGC2) from −34 dB to 0 dB, and then ramps the input stage gain (TGC1) from minimum to maximum, nominally a 16 dB span. By applying the gain variation to the second stage of the preamplifier first, the input impedance of the preamplifier is held at a lowest value through most of the gain control range. Only at the deeper depths does the gain and therefore input impedance of the input stage of the preamplifier rise. Such a control scheme is appropriate for a transducer whose temporal response is optimized with a low impedance load. Control circuits with other apportionment of the gain between the input and output stages may be used. For example, the gain of the input gain stage increases to a maximum gain first, and then the gain of the output gain stage increases. In this way, the input impedance is higher over most of the gain control range and low only at the lowest gains (shallower depths) where the signal levels are the highest. Such a scheme would be appropriate for a transducer whose temporal response was optimized in driving a high impedance, since a low input impedance is used only when necessary for high signal levels. The TGC command is split between two output signals by the clipping action of Q30A/B. For a TGC voltage between 0V and 1.7V, Q30A is off, so the voltage at the positive input to U28A is the same as the TGC voltage. U28A buffers this voltage to create TGC2, the gain control command for the second stage amplifier. It is temperature compensated to offset the temperature dependence of the second stage amplifier and its control reference circuit shown in FIG. 6. RT1 an U24B and resistors R18, R19 and R21 apply the appropriate temperature compensation. TGC1 is generated by differential amplifier U23B. TGC2 is driven into the non-inverting input of differential amplifier U23B. Below a TGC voltage of 1.7V, TGC2 matches TGC, so the same voltages are being fed into the inverting and non-inverting inputs of U23B, and therefore its output voltage does not change over this range. It sits at the positive DC voltage that corresponds to minimum input stage gain (approximately 0.54V for this implementation). For TGC voltages above 1.7V, the input to U28A clips to 1.7V and so its output, the non-inverting input to U23B, stops rising. Above a TGC voltage of 1.7V, the output of U23B (TGC1) drops in voltage as TGC rises. As mentioned previously, the input stage gain and input impedance rise as the TGC1 command voltage drops in voltage. The scaling of TGC1 is the same as TGC, 20 dB/V The TGC command signal varies between 0 and 2.5V, but may have other values or ranges. The total TGC range is 50 dB (e.g., 20 dB/V for 0-2.5V), but greater or lesser ranges may be used.

A method is provided for varying an input impedance of a preamplifier used for ultrasound imaging or other uses. The method is implemented by the preamplifier and/or the control circuits of FIGS. 1-7. Alternatively, the method is implemented by different preamplifier and/or control circuits.

Contribution to an input impedance of a preamplifier from a lower input impedance amplifier to a higher input impedance amplifier transitions as a function of time. The lower and higher input impedance amplifiers being connected in parallel in the preamplifier. The transition varies the input impedance of the preamplifier. By gradually varying contribution to the preamplifier input impedance between the lower and higher input impedance amplifiers, a smooth input impedance function is provided over time. For example, different input impedances are provided for ultrasound signals from two or more different depths. The smooth variation or a small incremental change in input impedance associated with adjacent depths may avoid artifacts.

Both the lower and higher input impedance amplifiers contribute to the input impedance of the preamplifier at a same time. A portion of the range of variation in input impedance may result from use of one or the other of the lower and higher input impedance amplifiers. A crossover or mid region of the range includes contribution to the input impedance by both lower and higher input impedance amplifiers. By varying biases for the lower and higher input impedance amplifiers, the input impedance is controlled. By operating the lower and higher input impedance amplifiers at a same time (i.e., both have biases in an active range), the input impedance of the preamplifier is a function of the relative contributions of the lower and higher input impedance. Changes in the bias level alter the contribution.

The preamplifier amplifies ultrasound signals received from an ultrasound transducer. During a receive event, signals from different depths are applied to the preamplifier at different times. The input impedance of the preamplifier transitions or varies during at least a portion of the receive event. Ultrasound signals associated with different depths are applied to the preamplifier with different input impedance settings.

Acoustic signals attenuate during propagation. Received signals representing deeper depths may have smaller amplitude. To account for the attenuation, a time varying gain is applied to the ultrasound signals. In one embodiment, the received signals are gain corrected after pre amplification. In another embodiment, the received signals are gain corrected by pre amplification. The preamplifier amplifies the received signals as a function of time gain control. The gain of the preamplifier varies as a function of the transition in input impedance. Alternatively, the gain is independent of the variation in input impedance. In another alternative embodiment, the gain of the preamplifier varies as a function of the transition in input impedance for a portion of the gain control range and is independent of the transition in input impedance for a different portion of the gain control range. The gain variance applied by the preamplifier may account for the entire range of time gain control or only a portion of the range.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A variable input impedance preamplifier for ultrasound imaging, the preamplifier comprising:
a higher input impedance amplifier;
a lower input impedance amplifier connected in parallel with the higher input impedance amplifier, the higher and lower input impedance amplifiers being parallel inputs to the variable input impedance preamplifier; and
an ultrasound transducer connected with the higher and lower input impedance amplifiers.

2. The preamplifier of claim 1 wherein the higher input impedance amplifier comprises a common emitter amplifier.

3. The preamplifier of claim 1 wherein the lower input impedance amplifier comprises a common base amplifier.

4. The preamplifier of claim 3 wherein the higher input impedance amplifier comprises a common emitter amplifier, the lower input impedance amplifier having an input impedance of about 25 ohms or less.

5. The preamplifier of claim 1 wherein the lower and higher input impedance amplifiers are differential amplifiers;
further comprising:
a transformer having two outputs each connected with the lower and higher input impedance amplifiers and having an input connected with the ultrasound transducer.

6. A variable input impedance preamplifier for ultrasound imaging, the preamplifier comprising:
a higher input impedance amplifier;
a lower input impedance amplifier connected in parallel with the higher input impedance amplifier; and
an ultrasound transducer connected with the higher and lower input impedance amplifiers;
a control circuit operable to vary first and second bias currents to the lower and higher input impedance amplifiers, respectively.

7. The preamplifier of claim 6 wherein the control circuit is operable to gradually transition between the lower and higher input impedance amplifiers as a function of the first and second bias currents, both the lower and higher input impedance amplifiers operable to be active during at least a same portion of the transition.

8. The preamplifier of claim 6 wherein a gain of the preamplifier varies as a function of the first and second bias currents, the control circuit operable to vary the gain as a function of time relative to reception of acoustic echoes by the ultrasound transducer.

9. The preamplifier of claim 6 wherein the control circuit is operable to drive a base of the lower input impedance amplifier with an attenuated and voltage level shifted signal as compared to a time gain control signal.

10. The preamplifier of claim 6 wherein the control circuit comprises a temperature compensation circuit.

11. The preamplifier of claim 1 further comprising a current steering amplifier connected with the lower and higher input impedance amplifiers.

12. The preamplifier of claim 11 further comprising a control circuit operable to control a first gain of a first stage comprising the lower and higher input impedance amplifiers, the first gain being as a function of input impedance, and operable to control a second gain of the current steering amplifier.

13. The preamplifier of claim 1 further comprising an ultrasound receive beamformer channel connected with the lower and higher input impedance amplifiers.

14. A variable input impedance preamplifier, the preamplifier comprising:
 a higher input impedance amplifier;
 a lower input impedance amplifier connected in parallel with the higher input impedance amplifier, the higher and lower input impedance amplifiers being parallel inputs to the variable input impedance preamplifier; and
 a control circuit connected with the higher and lower impedance amplifiers, the control circuit operable to control an input impedance of the preamplifier in conjunction with a variance in gain of the preamplifier.

15. The preamplifier of claim 14 wherein the input impedance and gain are controlled as a function of bias currents of the higher and lower input impedance amplifiers.

16. The preamplifier of claim 14 wherein the higher input impedance amplifier comprises a common emitter amplifier, the lower input impedance amplifier comprises a common base amplifier.

17. The preamplifier of claim 14 wherein the control circuit is operable to gradually transition between the lower and higher input impedance amplifiers as a function of first and second bias currents, both the lower and higher input impedance amplifiers operable to be active during at least a same portion of the transition.

18. A method for varying an input impedance of a preamplifier used for ultrasound imaging, the method comprising:
 transitioning contribution to the input impedance of the preamplifier from a lower input impedance amplifier to a higher input impedance amplifier as a function of time, the lower and higher input impedance amplifiers being connected in parallel; and
 amplifying ultrasound signals with the preamplifier while transitioning.

19. The method of claim 18 further comprising:
 varying a gain of the preamplifier as a function of the transitioning.

20. The method of claim 18 wherein transitioning comprises gradually varying between the lower and higher input impedance amplifiers, both the lower and higher input impedance amplifiers contributing to the input impedance at a same time over a range of the input impedance.

21. The method of claim 18 wherein transitioning comprises varying first and second biases for the lower and higher input impedance amplifiers, respectively.

22. The method of claim 18 wherein amplifying comprises amplifying as a function of time gain control.

23. The preamplifier of claim 1 wherein the lower input impedance amplifier is connected in parallel with the higher input impedance amplifier between the ultrasound transducer and an ultrasound receive beamformer channel.

* * * * *